(12) United States Patent
Chung et al.

(10) Patent No.: US 7,545,027 B2
(45) Date of Patent: Jun. 9, 2009

(54) WAFER LEVEL PACKAGE HAVING REDISTRIBUTION INTERCONNECTION LAYER AND METHOD OF FORMING THE SAME

(75) Inventors: Hyun-Soo Chung, Hwaseong-si (KR); In-Young Lee, Yongin-si (KR); Dong-Hyeon Jang, Suwon-si (KR); Myeong-Soon Park, Suwon-si (KR); Dong-Ho Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 336 days.

(21) Appl. No.: 11/448,772

(22) Filed: Jun. 8, 2006

(65) Prior Publication Data

US 2007/0108573 A1 May 17, 2007

(30) Foreign Application Priority Data

Nov. 17, 2005 (KR) .................... 10-2005-0110123

(51) Int. Cl.
*H01L 23/02* (2006.01)

(52) U.S. Cl. .................. 257/678; 257/701; 438/106; 438/121; 438/125

(58) Field of Classification Search .......... 257/678, 257/701; 438/106, 121, 125
See application file for complete search history.

(56) References Cited

U.S. PATENT DOCUMENTS 6,362,087 B1* 3/2002 Wang et al. ............... 438/597
6,730,589 B2* 5/2004 Hashimoto ................ 438/613
7,196,000 B2* 3/2007 Lee et al. .................. 438/612
2002/0162998 A1* 11/2002 Okuda et al. ............... 257/59

FOREIGN PATENT DOCUMENTS

| JP | 2000-286283 | 10/2000 |
|---|---|---|
| KR | 10-2001-0004529 | 1/2001 |
| KR | 10-2005-0011404 | 1/2005 |

* cited by examiner

*Primary Examiner*—Thao X Le
*Assistant Examiner*—Tanika Warrior
(74) *Attorney, Agent, or Firm*—Harness, Dickey & Pierce, P.L.C.

(57) ABSTRACT

A wafer level package may include a semiconductor substrate supporting an electrode pad. A first insulating layer may be provided on the semiconductor substrate. The first insulating layer may include a first opening through which the electrode pad may be exposed. A seed metal layer may be provided on an entire surface of the first insulating layer. A redistribution interconnection metal layer may be provided on the seed metal layer. A second insulating layer may be provided on the redistribution interconnection metal layer. The second insulating layer may have a second opening spaced from the first opening to expose a portion of the redistribution interconnection metal layer. The second insulating layer may surround the redistribution interconnection metal layer. An unwanted portion of seed metal layer may be removed using the second insulating layer as an etch mask.

22 Claims, 7 Drawing Sheets

WAFER LEVEL PACKAGE HAVING REDISTRIBUTION INTERCONNECTION LAYER AND METHOD OF FORMING THE SAME

PRIORITY STATEMENT

This application claims the benefit of Korean Patent Application No. 10-2005-0110123, filed on Nov. 17, 2005, in the Korean Intellectual Property Office, the disclosure of which is incorporated herein in its entirety by reference.

BACKGROUND

1. Field of the Invention

Example non-limiting embodiments of the present invention relate generally to a wafer level package, and more particularly, to a method for forming a redistribution interconnection metal layer.

2. Description of the Related Art

Wafer level packaging may proceed with a semiconductor chip having a semiconductor device which may not be separated from a wafer.

In wafer level packaging, a redistribution interconnection metal layer may be provided on an electrode pad to support external connection electrodes that may be disposed on the surface of the semiconductor substrate. FIGS. 1A through 1F show a conventional method that may be implemented to provide a redistribution interconnection metal layer in a wafer level package.

Referring to FIG. 1A, a first insulating layer 20 may be provided on a passivation layer 13 that may be provided on a semiconductor substrate 10. The first insulating layer 20 and the passivation layer 13 may be patterned to expose an electrode pad 11 that may be provided on the semiconductor substrate 10.

Referring to FIG. 1B, a seed metal layer 30 may be provided on the first insulating layer 20 and the exposed portion of the electrode pad 11.

Referring to FIG. 1C, a photoresist pattern (not shown) may be provided on the seed metal layer 30, and a redistribution interconnection metal layer 40 may be provided on the portions of the seed metal layer 30 that may be exposed through the photoresist pattern. The redistribution interconnection metal layer 40 may be formed by electrical plating, for example. The redistribution interconnection metal layer 40 may be provided on portions of the seed metal layer 30, which may be provided on the entire surface of the semiconductor substrate.

Referring to FIG. 1D, unwanted portions of the seed metal layer 30 may be removed via a wet etching process using the redistribution interconnection metal layer 40 as a mask.

Referring to FIG. 1E, a second insulating layer 50 may be provided on the redistribution interconnection metal layer 40. The second insulating layer 50 may be patterned to expose a portion of the redistribution interconnection metal layer 40.

Referring to FIG. 1F, a connection electrode 60 may be provided on the exposed portion of the redistribution interconnection metal layer 40.

Although the conventional art is generally thought to provide acceptable results, it is not without shortcomings. For example, during wet etching of the seed metal layer 30, an exposed side portion of the redistribution interconnection metal layer 40 may be etched and undercut.

FIG. 2 shows an undercut that may be formed beneath the redistribution interconnection metal layer 40. Here, the redistribution interconnection metal layer 40 may include a Cu layer 41, a Ni layer 43 and an Au layer 45, for example. The wet etching performed on the seed metal layer 30 may be an isotropic etch, for example. Thus, the undercut may occur on the redistribution interconnection metal layer 40 when the seed metal layer 30 is removed. The undercut may cause the redistribution interconnection metal layer 40 to separate from the substrate when the second insulating layer 50 (which may be fabricated from polyimide, for example) is provided through spin coating process, for example. Further, air, which may be confined in the undercut of the redistribution interconnection metal layer 40, may expand and form bubbles when the second insulating layer 50 is provided. The bubbles may raise the second insulating layer 50 from the redistribution interconnection metal layer 40.

SUMMARY

According to an example, non-limiting embodiment, a wafer level package may include a semiconductor substrate that may support an electrode pad. A first insulating layer may be provided on the semiconductor substrate. The first insulating layer may have a first opening through which the electrode pad may be exposed. A seed metal layer may be provided on the electrode pad and the first insulating layer. A redistribution interconnection metal layer may be provided on a portion of a surface of the seed metal layer so that an edge portion of the surface of the seed metal layer may be exposed. A second insulating layer may be provided on the exposed edge portion of the surface of the seed metal layer and the redistribution interconnection metal layer. The second insulating layer may have a second opening through which a portion of the redistribution interconnection metal layer may be exposed. The exposed portion of the redistribution interconnection metal layer may be spaced apart from the electrode pad. An external connection electrode may be provided on the exposed portion of the redistribution interconnection metal layer.

According to another example, non-limiting embodiment, a method may involve providing a semiconductor substrate that may support an electrode pad. A first insulating layer may be provided on the semiconductor substrate. The first insulating layer may include a first opening through which the electrode pad may be exposed. A seed metal layer may be provided on an entire surface of the first insulating layer. A redistribution interconnection metal layer may be provided on the seed metal layer. A second insulating layer may be provided on the redistribution interconnection metal layer. The second insulating layer may surround the redistribution interconnection metal layer and may include a second opening through which a portion of the redistribution interconnection metal layer may be exposed. The second opening may be spaced apart from the first opening. A portion of the seed metal layer may be removed using the second insulating layer as an etch mask.

According to another example, non-limiting embodiment, a package may include a semiconductor substrate that may support an electrode pad. A first insulating layer may be provided on the semiconductor substrate so that the electrode pad may be exposed. A seed metal layer may be provided on the electrode pad and the first insulating layer. A redistribution interconnection metal layer may be provided on a portion of a surface of the seed metal layer so that an edge portion of the surface of the seed metal layer may be exposed. A second insulating layer may be provided on the exposed edge portion of the surface of the seed metal layer and the redistribution interconnection metal layer.

BRIEF DESCRIPTION OF THE DRAWINGS

Example, non-limiting embodiments of the present invention will be described with reference to the attached drawings.

Figure 1A:
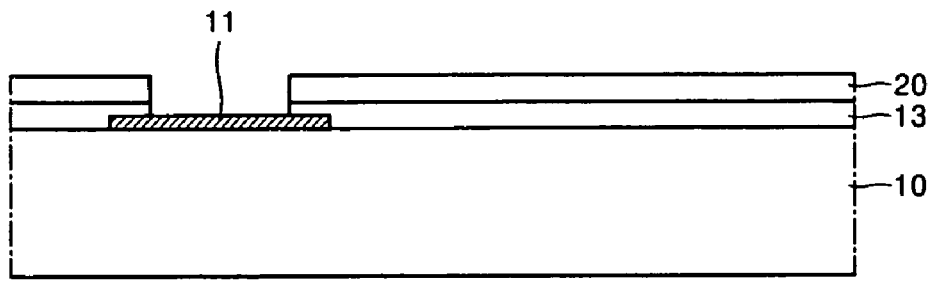
FIGS. 1A through 1F are cross-sectional views of a conventional method that may be implemented to form a redistribution interconnection metal layer of a wafer level package.
Figure 1B:
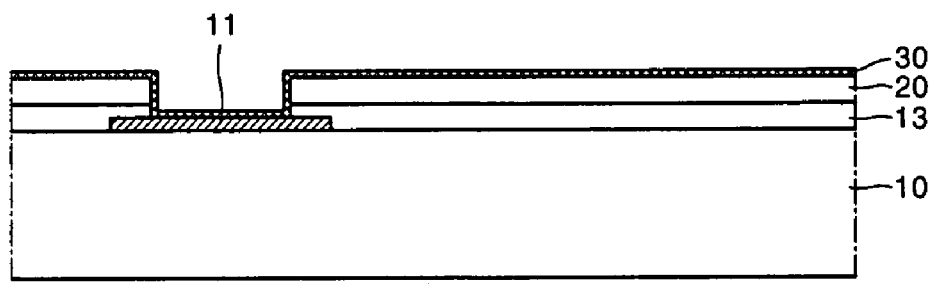
Figure 1C:
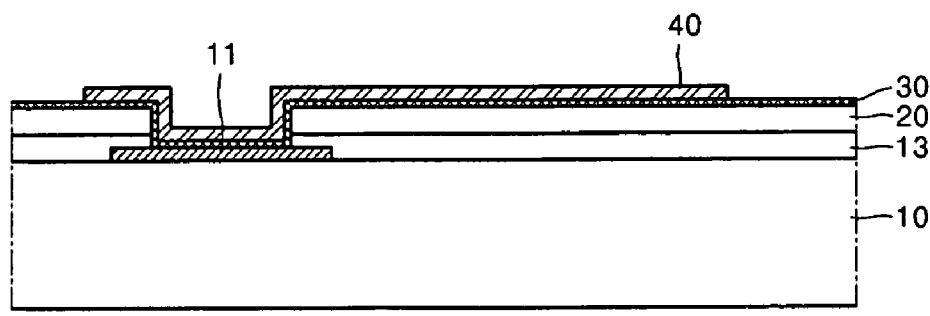
Figure 1D:
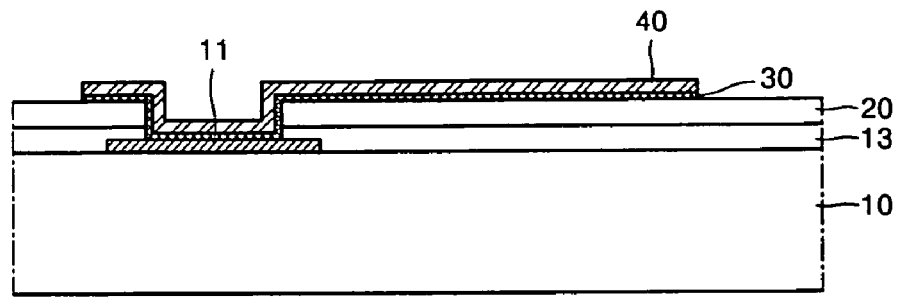

The drawings are provided for illustrative purposes only and are not drawn to scale. The spatial relationships and relative sizing of the elements illustrated in the various embodiments may be reduced, expanded and/or rearranged to improve the clarity of the figure with respect to the corresponding description. The figures, therefore, should not be interpreted as accurately reflecting the relative sizing or positioning of the corresponding structural elements that could be encompassed by an actual device manufactured according to example embodiments of the invention. Like reference numerals in the drawings denote like elements, and thus their description may be omitted.

DETAILED DESCRIPTION OF EXAMPLE, NON-LIMITING EMBODIMENTS

Example, non-limiting embodiments of the present invention will be described with reference to the accompanying drawings. The invention may, however, be embodied in many different forms and should not be construed as being limited to the embodiments set forth herein. Rather, the disclosed embodiments are provided so that this disclosure will be thorough and complete, and will fully convey the scope of the invention to those skilled in the art.

Well-known structures and processes are not described or illustrated in detail to avoid obscuring the present invention.

An element is considered as being mounted (or provided) "on" another element when mounted or provided) either directly on the referenced element or mounted (or provided) on other elements overlaying the referenced element. Throughout this disclosure, spatial terms such as "upper," "lower," "above" and "below" (for example) are used for convenience in describing various elements or portions or regions of the elements as shown in the figures. These terms do not, however, require that the structure be maintained in any particular orientation.

Figure 3:
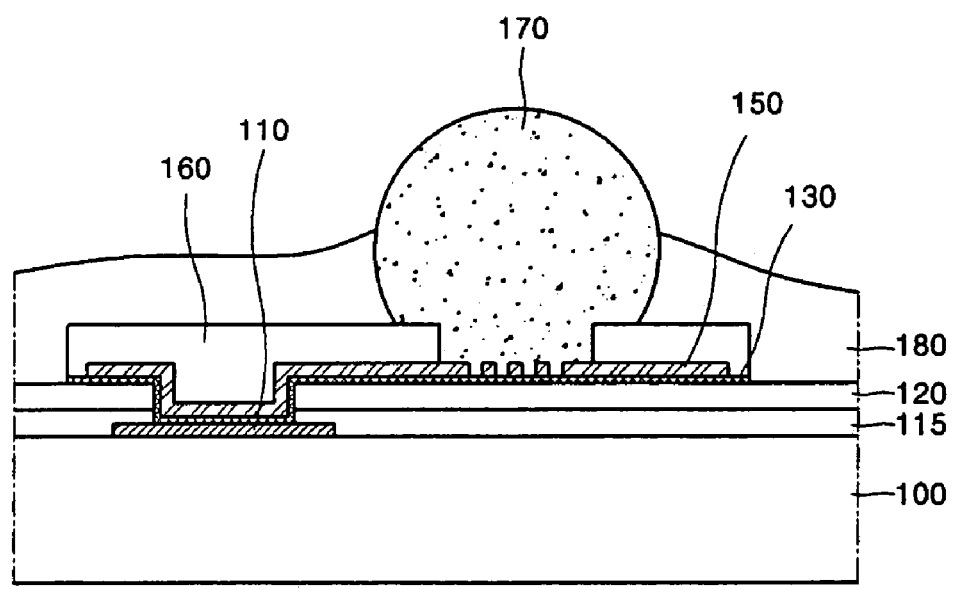
FIG. 3 is a cross-sectional view of a wafer level package having a redistribution interconnection layer according to an example, non-limiting embodiment of the present invention.

Referring to FIG. 3, a semiconductor substrate 100 may support an electrode pad 110. A passivation layer 115 and a first insulating layer 120 may be provided on the semiconductor substrate 100 so that a portion of the electrode pad 110 may be exposed. A seed metal layer 130 may be provided on the exposed portion of the electrode pad 110 and the first insulating layer 120. A redistribution interconnection metal layer 150 may be provided on the seed metal layer 130.

As shown, the seed metal layer 130 may extend beyond a side of the redistribution interconnection metal layer 150. A second insulating layer 160 may be provided on the redistribution interconnection metal layer 150 and the extended portion of the seed metal layer 130. The extended portion of the seed metal layer 130 may be flush with the side of the second insulating layer 160. The second insulating layer 160 and the seed metal layer 130 may extend the same length across the surface of the semiconductor substrate 100. The second insulating layer 160 may cover the side wall of the redistribution interconnection metal layer 150. In this way, the second insulating layer 160 may reduce the chances of an undercut being formed on the side of the redistribution interconnection metal layer 150 when unwanted portions of the seed metal layer 130 are removed via an etching process.

The second insulating layer 160 may be provided on the redistribution interconnection metal layer 150 so that a portion of the redistribution interconnection metal layer 150 may be exposed. An external connection electrode 170 may be provided on the exposed portion of the redistribution interconnection metal layer 150. A third insulating layer 180 may be provided on the semiconductor substrate 100.

Figure 1E:
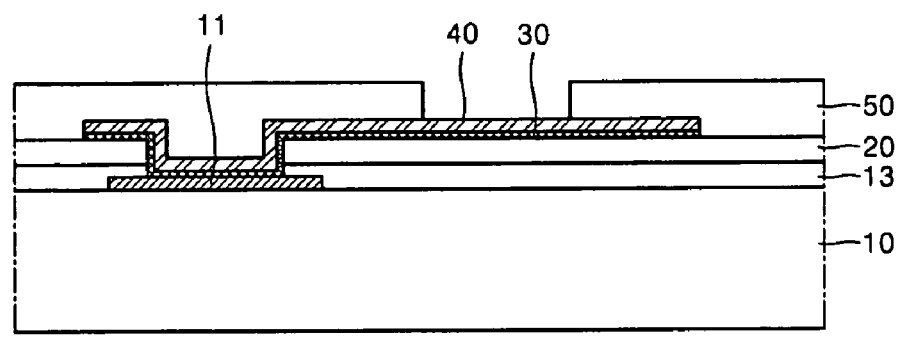
Figure 1F:
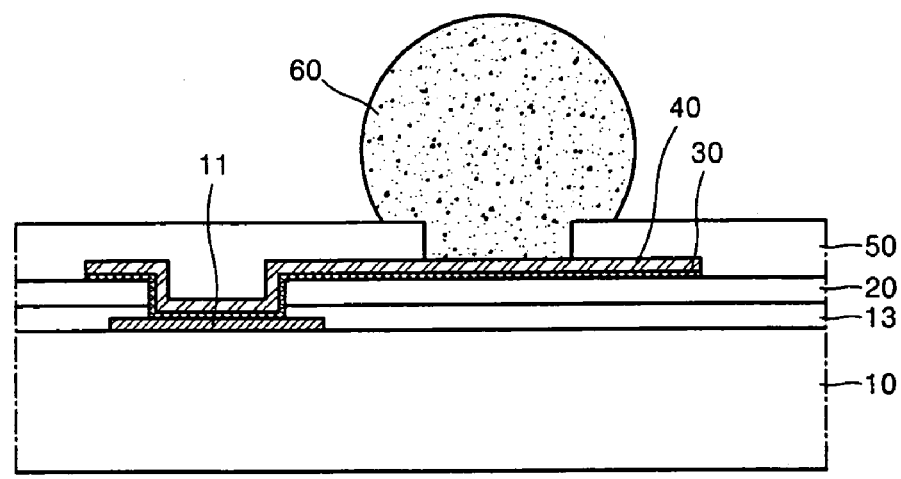
Figure 2:
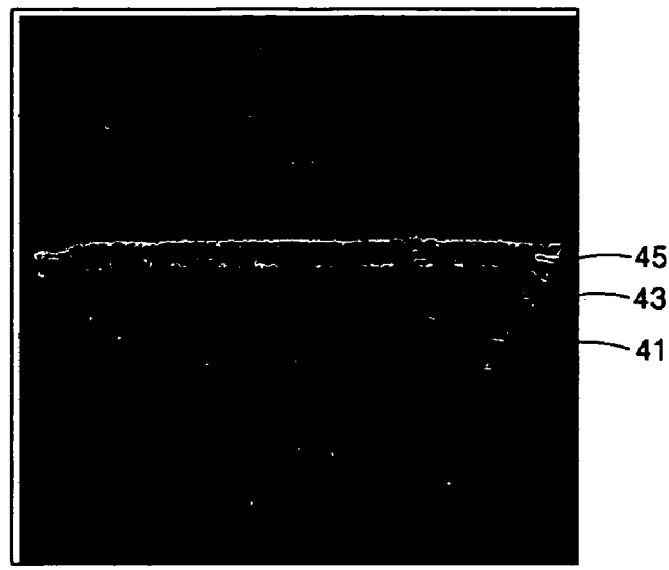
FIG. 2 is a photograph showing an undercut that may occur on a redistribution interconnection metal layer in a conventional wafer level packaging process.

As compared to the second insulating layer 50 depicted in FIGS. 1E and 1F, the second insulating layer 160 may have a reduced thickness that may facilitate patterning of the insulating layer to expose portions of the underlying redistribution interconnection metal layer 150.

FIGS. 4A through 4H are cross-sectional views of a process that may be implemented to form a wafer level package having a redistribution interconnection layer according to an example, non-limiting embodiment of the present invention.

Figure 4A:
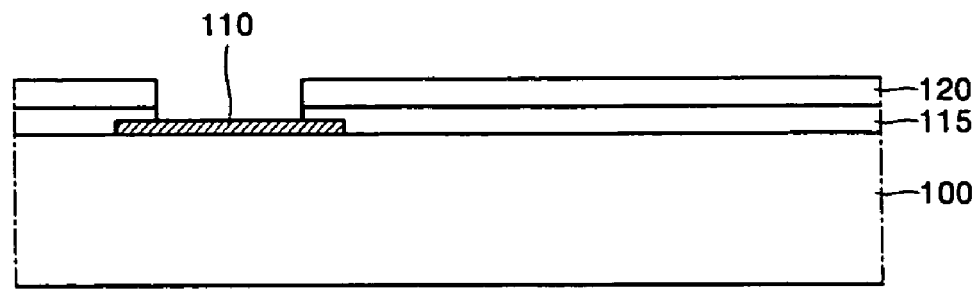
FIGS. 4A through 4H are cross-sectional views of a process that may be implemented to form a wafer level package having a redistribution interconnection layer according to an example, non-limiting embodiment of the present invention.

Referring to FIG. 4A, the passivation layer 115 may be provided on the semiconductor substrate 100 so that the electrode pad 110 may be exposed. The first insulating layer 120 may be provided on the passivation layer 115 so that the electrode pad 110 may be exposed. By way of example only, the first insulating layer 120 may be formed by spin-coating a photosensitive polyimide, which may be exposed and developed to expose the electrode pad 110.

Figure 4B:
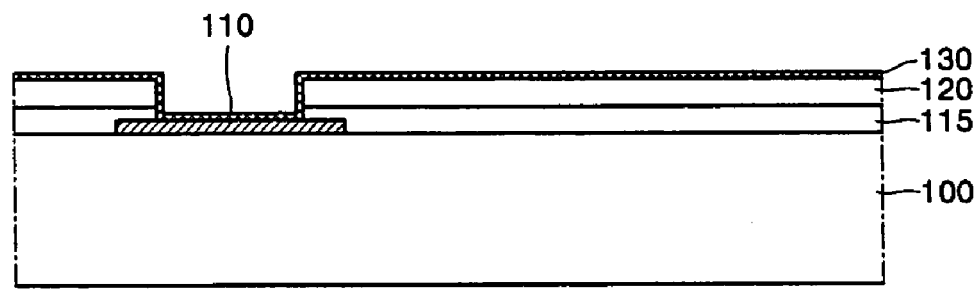

Referring to FIG. 4B, the seed metal layer 130 may be provided on the first insulating layer 120. The seed metal layer 130 may be formed by sputtering Ti/Cu and/or Ni/Cu, for example. The seed metal layer 130 may have a thickness ranging from 1000 to 2000 Å. The seed metal layer 130 may facilitate formation of the redistribution interconnection metal layer.

Figure 4C:
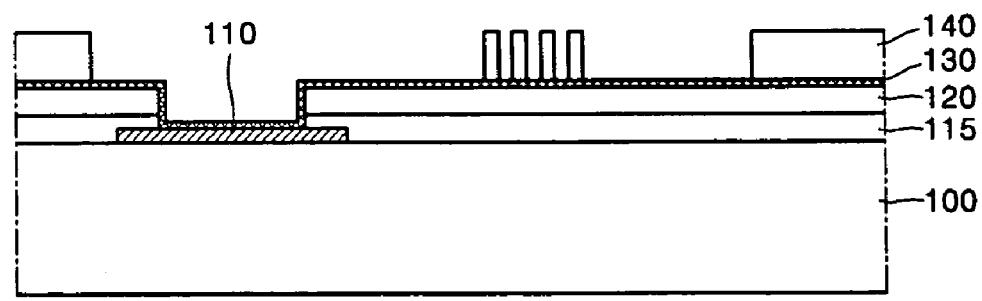

Referring to FIG. 4C, a photoresist pattern 140 may be provided on the seed metal layer 130. The photoresist pattern 140 may define the redistribution interconnection metal layer. A portion of the redistribution interconnection metal layer to be connected with the external connection electrode may be patterned to have a plurality of divided fine patterns.

Figure 4D:
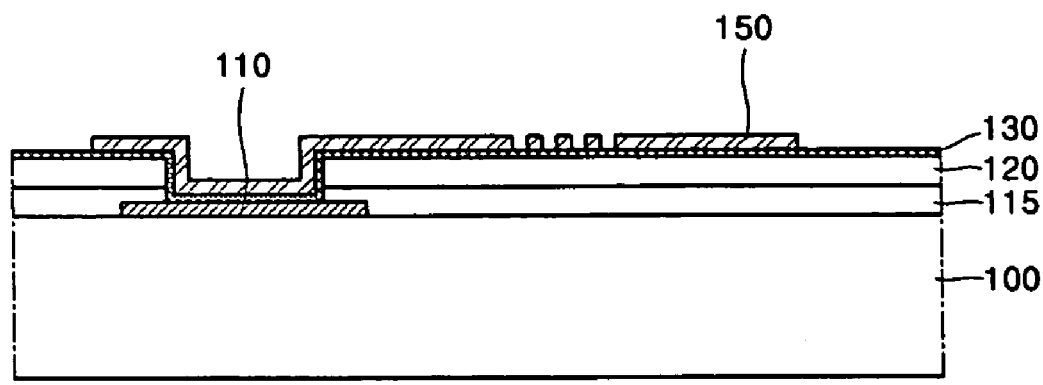

Referring to FIG. 4D, a redistribution interconnection metal layer 150 may be provided on portions of the seed metal layer 130 that may be exposed through the photoresist pattern 140. The redistribution interconnection metal layer 150 may be provided by electrical plating, for example. The photoresist pattern 140 may be removed. By way of example only, the redistribution interconnection metal layer 150 may include a lower layer of Cu (not shown) and an upper layer of Ni (not shown). In alternative embodiments, the redistribution interconnection metal layer 150 may additionally include an Au layer on the upper layer of Ni. The redistribution interconnection metal layer 150 may be fabricated from numerous and varied materials that are well known in this art. The redistribution interconnection metal layer 150 may be electrically connected to the electrode pad 110. The plurality of divided fine patterns of the redistribution interconnection metal layer 150 may be connected to the external connection electrode. The plurality of divided fine patterns may strengthen adhesion between the redistribution interconnection metal layer 150 and the external connection electrode.

Figure 4E:
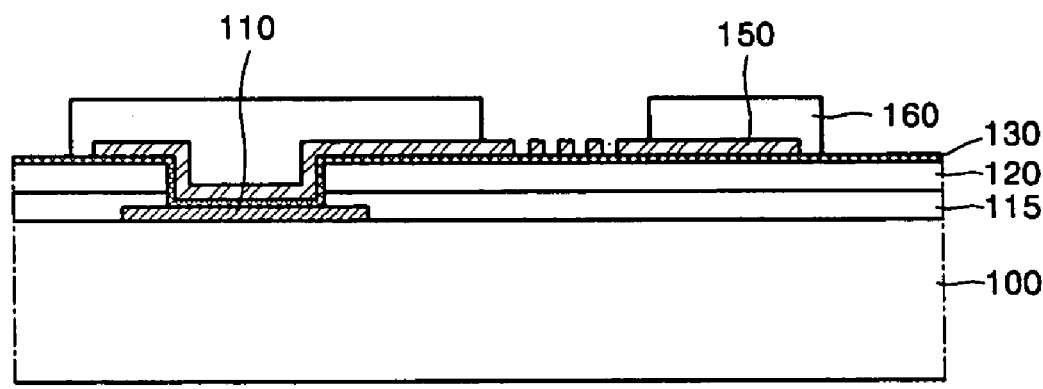

Referring to FIG. 4E, the second insulating layer 160, which may be fabricated from photosensitive polyimide, for example, may be provided on the redistribution interconnection metal layer 150. The second insulating layer 160 may be patterned (via exposure and development techniques, for example) to expose the divided fine patterns of the redistribution interconnection metal layer 150. As shown, the second insulating layer 160 may cover the top and side surfaces of the redistribution interconnection metal layer 150, excluding the opening.

The seed metal layer 130 may be provided on the entire surface of the semiconductor substrate 100. The portion of the seed metal layer 130 extending beyond (and thus exposed by) the second insulating layer 160 may be removed to prevent short-circuiting.

Figure 4F:
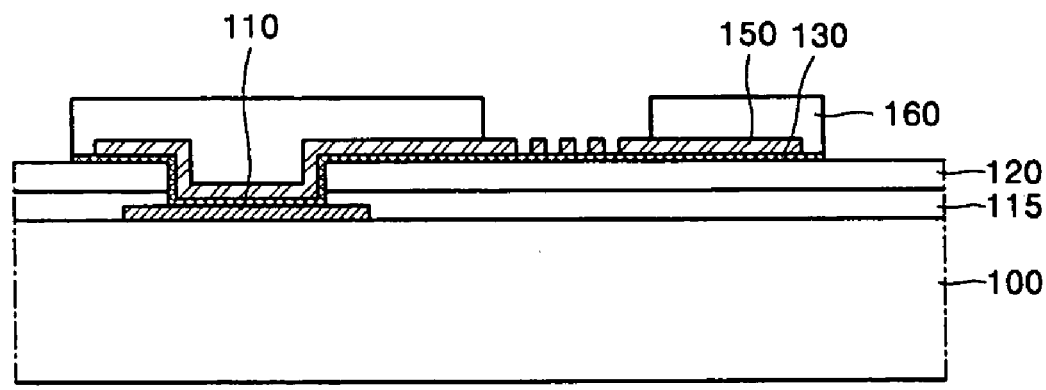

Referring to FIG. 4F, the exposed portion of the seed metal layer 130 extended beyond the second insulating layer 160 may be removed by wet etching using the second insulating layer 160 as a mask. The second insulating layer 160 may shield the redistribution interconnection metal layer 150 from a chemical etchant that may be used during the wet etching process. In this way, the redistribution interconnection metal layer 150 may not be undercut when the seed metal layer 130 is wet etched.

Figure 4G:
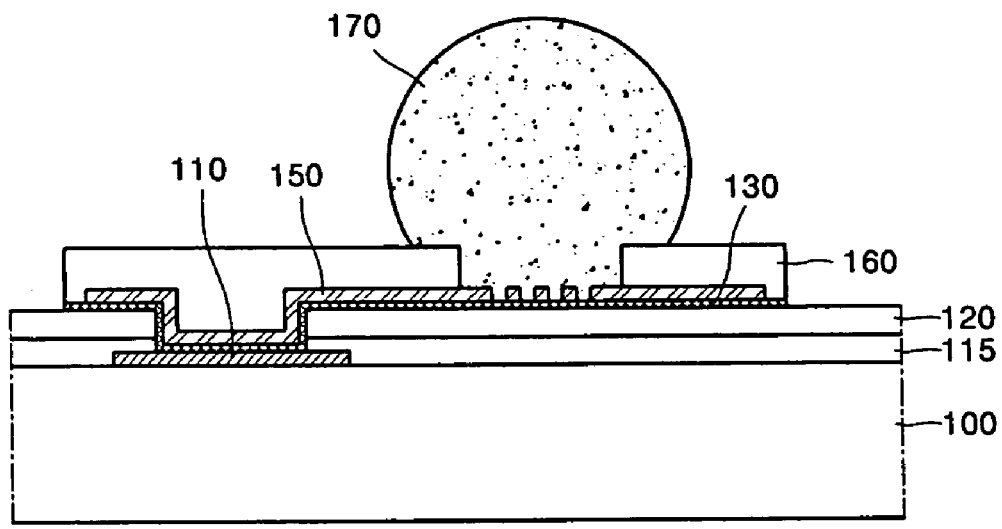

Referring to FIG. 4G, an external connection electrode 170 may be provided on the redistribution interconnection metal layer 150 that may be exposed through the second insulating layer 160. By way of example only, the external connection electrode 170 may be a solder ball including Pb/Sn. Numerous and varied external connection terminal, which are well known in this art, may be suitably implemented.

Figure 4H:
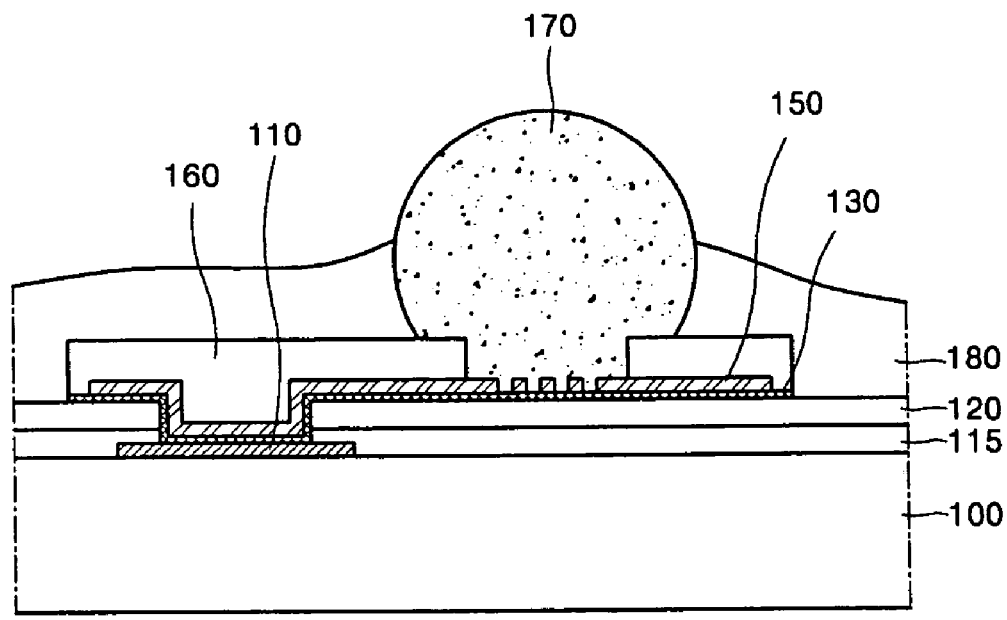

Referring to FIG. 4H, a third insulating layer 180 may be provided on the semiconductor substrate 100 so that the external connection electrode 170 may be exposed. The third insulating layer 180 may be fabricated from a photosensitive polyimide and/or another insulating material that is well known in this art. The third insulating layer 180 may support the external connection electrode 170.

Figure 5A:
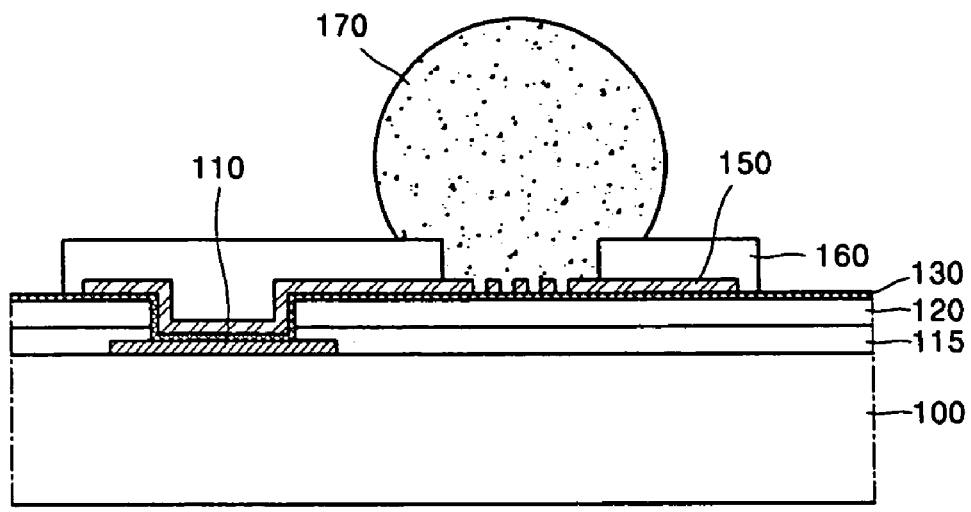
FIGS. 5A and 5B are cross-sectional views of a partial process that may be implemented to form a wafer level package having a redistribution interconnection layer according to another example, non-limiting embodiment of the present invention.
Figure 5B:
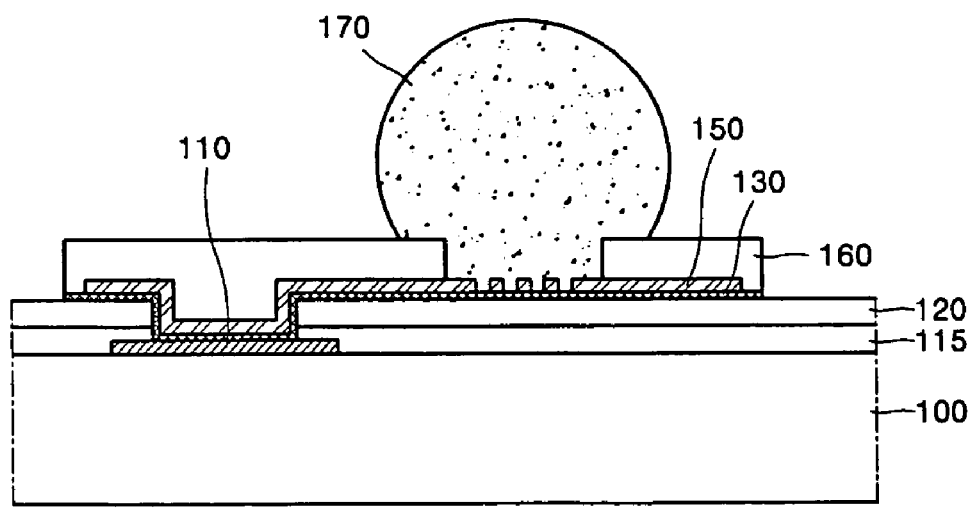

FIGS. 5A through 5B are cross-sectional views of a partial process that may be implemented to form a wafer level package having a redistribution interconnection layer according to another example, non-limiting embodiment of the present invention. Here, processes from a process of providing a first insulating layer 120 to a process of providing a second insulating layer 160 may be the same as the processes shown in FIGS. 4A through 4E.

Referring to FIG. 5A, the external connection electrode 170 may be provided on the portion of the redistribution interconnection metal layer 150 that may be exposed through the second insulating layer 160, before removing the unwanted portions of the seed metal layer 130. By way of example only, the external connection electrode 170 may be a solder ball including Pb/Sn.

Referring to FIG. 5B, the exposed portion of the seed metal layer 130 extended beyond the second insulating layer 160 may be removed by wet etching using the second insulating layer 160 as a mask. The external connection electrode 170 may not be affected by wet etching because the external connection electrode 170 may have a thickness of several hundred μm and etching selectivity with respect to the seed metal layer 130.

A third insulating layer 180 may be provided as described with reference to FIG. 4H.

According to example, non-limiting embodiments of the present invention, the redistribution interconnection metal layer may not be undercut upon wet etching the seed metal layer because the second insulating layer may shield the redistribution interconnection metal layer from chemical etchant that may be used during wet etching. Accordingly, the redistribution interconnection metal layer may not become separated from the semiconductor substrate and/or bubbles may not be formed under the redistribution interconnection metal layer when the second insulating layer is formed, thereby resulting in a more reliable wafer level package.

In addition, as compared to conventional structures, the second insulating layer provided on the redistribution interconnection metal layer may have a reduced thickness, which may facilitate patterning of the second insulating layer.

The present invention has been shown and described with reference to example, non-limiting embodiments. It will be understood by those of ordinary skill in the art that various changes in form and details may be suitably implemented without departing from the spirit and scope of the present invention as defined by the following claims.

What is claimed is:

1. A wafer level package, comprising:
a semiconductor substrate supporting an electrode pad;
a first insulating layer provided on the semiconductor substrate, the first insulating layer having a first opening through which the electrode pad is exposed;
a seed metal layer provided on the electrode pad and the first insulating layer;
a redistribution interconnection metal layer provided on a portion of a surface of the seed metal layer so that an edge portion of the surface of the seed metal layer is exposed;
a second insulating layer provided on the exposed edge portion of the surface of the seed metal layer and the redistribution interconnection metal layer, the second insulating layer having a second opening through which a portion of the redistribution interconnection metal layer is exposed, the exposed portion of the redistribution interconnection metal layer being spaced apart from the electrode pad; and
an external connection electrode provided on the exposed portion of the redistribution interconnection metal layer,
wherein the seed metal layer extends beyond a side of the redistribution interconnection metal layer, and the second insulating layer is provided on the redistribution interconnection metal layer and the extended portion of the seed metal layer.

2. The wafer level package of claim 1, further comprising a passivation layer interposed between the first insulating layer and the semiconductor substrate.

3. The wafer level package of claim 1, wherein the first insulating layer is fabricated from a photosensitive polyimide.

4. The wafer level package of claim 1, wherein the seed metal layer is fabricated from at least one of Ti/Cu and Ni/Cu.

5. The wafer level package of claim 1, wherein the redistribution interconnection metal layer is fabricated from at least one of Cu, Ni, Au, Cr, Ti, Pd and a combination thereof.

6. The wafer level package of claim 1, wherein the portion of the redistribution interconnection metal layer supporting the connection electrode includes a plurality of divided fine patterns.

7. The wafer level package of claim 1, wherein the second insulating layer is fabricated from a photosensitive polyimide layer.

8. The wafer level package of claim 1, wherein a side wall of the second insulating layer is flush with a side wall of the seed metal layer.

9. The wafer level package of claim 1, further comprising a third insulating layer provided on the first insulating layer, the second insulating layer and the external connection electrode, the third insulating layer exposing a surface of the external connection electrode.

10. A method comprising:
providing a semiconductor substrate supporting an electrode pad;
providing a first insulating layer on the semiconductor substrate, the first insulating layer including a first opening through which the electrode pad is exposed;
providing a seed metal layer on an entire surface of the first insulating layer;
providing a redistribution interconnection metal layer on the seed metal layer;
providing a second insulating layer on the redistribution interconnection metal layer, the second insulating layer surrounding the redistribution interconnection metal layer and including a second opening through which a portion of the redistribution interconnection metal layer is exposed, the second opening being spaced apart from the first opening; and
removing a portion of the seed metal layer using the second insulating layer as an etch mask.

11. The method of claim 10, further comprising, prior to providing the first insulating layer, providing a passivation layer on the semiconductor substrate.

12. The method of claim 10, wherein the first insulating layer is fabricated from photosensitive polyimide.

13. The method of claim 10, wherein the seed metal layer is formed by sputtering at least one of Ti/Cu and Ni/Cu.

14. The method of claim 10, wherein the redistribution interconnection metal layer is fabricated from at least one of Cu, Ni, Au, Cr, Ti, Pd, and a combination thereof.

15. The method of claim 14, wherein the redistribution interconnection metal layer is formed by electrical plating.

16. The method of claim 10, wherein the second insulating layer is fabricated from photosensitive polyimide.

17. The method of claim 10, further comprising forming a plurality of divided fine patterns in the portion of the redistribution interconnection metal layer.

18. The method of claim 10, further comprising, after removing the portion of the seed metal layer, providing an external connection electrode on the portion of the redistribution interconnection metal layer exposed through the second opening.

19. The method of claim 10, further comprising, after providing the second insulating layer and before removing a portion of the seed metal layer, providing an external connection electrode on the portion of the redistribution interconnection metal layer exposed through the second opening.

20. The method of claim 10, further comprising:
providing an external connection electrode on the portion of the redistribution interconnection metal layer exposed through the second opening; and
providing a third insulating layer on the first insulating layer, the second insulating layer, and the external connection electrode so that a surface of the external connection electrode is exposed.

21. The method of claim 20, wherein the third insulating layer is fabricated from photosensitive polyimide.

22. A package, comprising:
a semiconductor substrate supporting an electrode pad;
a first insulating layer provided on the semiconductor substrate so that the electrode pad is exposed;
a seed metal layer provided on the electrode pad and the first insulating layer;
a redistribution interconnection metal layer provided on a portion of a surface of the seed metal layer so that an edge portion of the surface of the seed metal layer is exposed;
a second insulating layer provided on the exposed edge portion of the surface of the seed metal layer and the redistribution interconnection metal layer,
wherein the seed metal layer extends beyond a side of the redistribution interconnection metal layer, and the second insulating layer is provided on the redistribution interconnection metal layer and the extended portion of the seed metal layer.

* * * * *